United States Patent
Takahashi et al.

(10) Patent No.: US 11,468,923 B2
(45) Date of Patent: Oct. 11, 2022

(54) APPARATUSES AND METHODS FOR CONTROLLING DATA TIMING IN A MULTI-MEMORY SYSTEM

(71) Applicant: MICRON TECHNOLOGY, INC., Boise, ID (US)

(72) Inventors: Tsugio Takahashi, Tsukuba (JP); Zer Liang, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 104 days.

(21) Appl. No.: 16/924,023

(22) Filed: Jul. 8, 2020

(65) Prior Publication Data

US 2020/0342920 A1 Oct. 29, 2020

Related U.S. Application Data

(60) Division of application No. 16/136,068, filed on Sep. 19, 2018, now Pat. No. 10,748,584, which is a division of application No. 15/626,915, filed on Jun. 19, 2017, now Pat. No. 10,109,327, which is a continuation of application No. 13/804,461, filed on Mar. 14, 2013, now Pat. No. 9,715,909.

(51) Int. Cl.
*G11C 7/10* (2006.01)

(52) U.S. Cl.
CPC .......... *G11C 7/1039* (2013.01); *G11C 7/1003* (2013.01)

(58) Field of Classification Search
CPC ............................ G11C 7/1039; G11C 7/1003
USPC .................................................. 365/230.03
See application file for complete search history.

(56) References Cited

U.S. PATENT DOCUMENTS

| | | | |
|---|---|---|---|
| 4,016,542 A | 4/1977 | Azure | |
| 4,030,072 A | 6/1977 | Bjornsson | |
| 4,367,531 A | 1/1983 | Furuhashi et al. | |
| 4,527,250 A | 7/1985 | Galdun et al. | |
| 4,949,308 A | 8/1990 | Araki et al. | |
| 5,262,996 A | 11/1993 | Shiue | |
| 5,341,494 A | 8/1994 | Thayer et al. | |
| 5,430,859 A | 7/1995 | Norman et al. | |
| 5,838,915 A | 11/1998 | Klausmeier et al. | |
| 6,134,149 A | 10/2000 | Lin | |
| 6,134,179 A * | 10/2000 | Ooishi | G11C 8/18 365/233.14 |

(Continued)

FOREIGN PATENT DOCUMENTS

| | | |
|---|---|---|
| CN | 101467214 A | 6/2009 |
| JP | 2003051194 A | 2/2003 |

(Continued)

*Primary Examiner* — Anthan Tran
(74) *Attorney, Agent, or Firm* — Dorsey & Whitney LLP

(57) ABSTRACT

Apparatuses, mufti-memory systems, and methods for controlling data timing in a multi-memory system are disclosed. An example apparatus includes a plurality of memory units. In the example apparatus, a memory unit of the plurality of memory units includes a memory configured to provide associated read data to a data pipeline based on row control signals and column control signals. The memory unit further includes local control logic configured to provide the row control signals and the column control signals to the memory, and a configurable delay circuit coupled between the local control logic and the memory, the configured to delay receipt of the column control signals to the memory.

20 Claims, 6 Drawing Sheets

(56) References Cited

U.S. PATENT DOCUMENTS

| | | |
|---|---|---|
| 6,173,432 B1 | 1/2001 | Harrison |
| 6,240,040 B1 | 5/2001 | Akaogi et al. |
| 6,275,895 B1 | 8/2001 | Tabo |
| 6,288,940 B1 | 9/2001 | Kawamura |
| 6,614,685 B2 | 9/2003 | Wong |
| 6,661,721 B2 | 12/2003 | Lehmann et al. |
| 6,883,061 B2 | 4/2005 | Seo et al. |
| 7,116,603 B2 | 10/2006 | Kanda et al. |
| 7,295,488 B2 | 11/2007 | Hwang et al. |
| 7,701,764 B2 | 4/2010 | Nguyen |
| 7,755,964 B2 | 7/2010 | Jung et al. |
| 8,295,100 B2 | 10/2012 | Lee |
| 8,432,738 B2 | 4/2013 | Nguyen |
| 8,526,251 B2 * | 9/2013 | Park .................. G11C 7/00 365/194 |
| 9,715,909 B2 | 7/2017 | Takahashi et al. |
| 10,109,327 B2 | 10/2018 | Takahashi et al. |
| 2001/0024135 A1 | 9/2001 | Harrison |
| 2003/0093702 A1 | 5/2003 | Luo et al. |
| 2003/0142571 A1 | 7/2003 | Kanda et al. |
| 2003/0198100 A1 | 10/2003 | Matsushita et al. |
| 2004/0148482 A1 | 7/2004 | Grundy et al. |
| 2005/0007835 A1 | 1/2005 | Lee et al. |
| 2005/0082579 A1 | 4/2005 | Horii et al. |
| 2005/0149780 A1 | 7/2005 | Avraham |
| 2005/0184787 A1 * | 8/2005 | Tomita ............ G11C 11/40615 327/277 |
| 2007/0011518 A1 | 1/2007 | Ung et al. |
| 2007/0260841 A1 | 11/2007 | Hampel et al. |
| 2007/0279988 A1 | 12/2007 | Nguyen |
| 2010/0020583 A1 * | 1/2010 | Kang .................. G11C 8/12 365/51 |
| 2010/0157683 A1 | 6/2010 | Nguyen |
| 2013/0308388 A1 | 11/2013 | Nguyen |
| 2014/0269121 A1 | 9/2014 | Takahashi et al. |
| 2017/0287531 A1 | 10/2017 | Takahashi et al. |
| 2019/0035439 A1 | 1/2019 | Takahashi et al. |

FOREIGN PATENT DOCUMENTS

| | | |
|---|---|---|
| JP | 2003-233994 | 8/2003 |
| JP | 2004-288267 | 10/2004 |
| KR | 10-0475433 | 3/2005 |
| WO | 2007/136944 A2 | 11/2007 |

* cited by examiner

APPARATUSES AND METHODS FOR CONTROLLING DATA TIMING IN A MULTI-MEMORY SYSTEM

CROSS REFERENCE TO RELATED APPLICATION(S)

This application is a divisional of U.S. patent application Ser. No. 16/136,068, filed Sep. 19, 2018, issued as U.S. Pat. No. 10,748,584 on Aug. 18, 2020, which is a divisional of U.S. patent application Ser. No. 15/626,915, filed Jun. 19, 2017, issued as U.S. Pat. No. 10,109,327 on Oct. 23, 2018, which is a continuation of U.S. patent application Ser. No. 13/804,461, filed Mar. 14, 2013, issued as U.S. Pat. No. 9,715,909 on Jul. 25, 2017. The aforementioned applications and patents are incorporated herein by reference, in their entirety, and for any purposes.

TECHNICAL FIELD

Embodiments of the disclosure relate generally to electronic memories, and more particularly, in one or more of the illustrated embodiments, to controlling the timing of when data is provided to a data pipeline by memory units in a multi-memory system.

DESCRIPTION OF RELATED ART

Advances in technology have resulted in high density memory architectures. The high density memory architecture has led to multi-memory systems that include several memory units. An example multi-memory system is a stacked memory system including several memory units stacked together. In order to make the multi-memory system transparent to external controllers, communication with individual memory units of a multi-memory system is facilitated through a memory unit identified as a master memory unit. The master memory unit receives the commands, addresses, and data and controls the operation of the other memory units of the multi-memory system. In some examples, all data read from and written to the multi-memory system is funneled through a shared data pipeline on the master memory unit. In existing multi-memory systems, delta timing between consecutive memory access commands is used to control data flow to the data pipeline. As minimum timing requirements between consecutive access commands continue to become more compressed, slight timing characteristic differences between individual memory units in the multi-memory system may result in data collisions at the data pipeline. Thus, accounting for relative timing differences between the individual memory units in providing data to the data pipeline is desired to improve operability of the multi-memory system.

DETAILED DESCRIPTION

Certain details are set forth below to provide a sufficient understanding of embodiments of the disclosure. However, it will be clear to one having ordinary skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
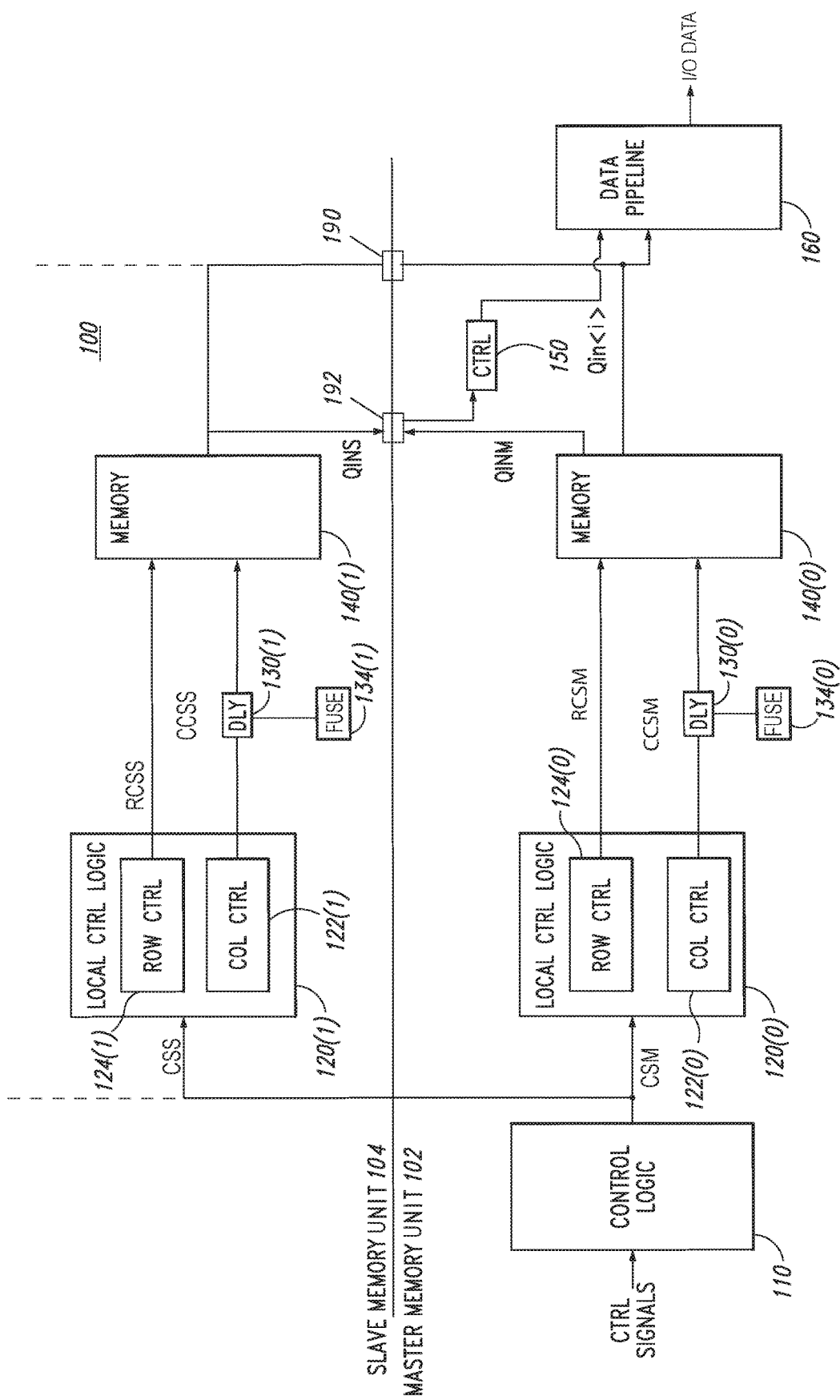
FIG. 1 is a block diagram of a particular illustrative embodiment of a multi-memory.

Referring to FIG. 1, a particular illustrative embodiment of an apparatus including a multi-memory system is disclosed and generally designated apparatus 100. As used herein, examples of apparatuses may include an integrated circuit, a memory device, a memory system, an electronic device or system, a smart phone, a tablet, a computer, a server, etc. The multi-memory system in some embodiments is a stacked multi-memory system including multiple memory units stacked on one another. The apparatus 100 may include a master memory unit 102 and a slave memory unit 104 that share a common data pipeline 160 located on the master memory unit 102 to provide I/O data to and from the multi-memory system. The master memory unit 102 and the slave memory unit 104 may exhibit slightly different timing characteristics, for example, due to process inconsistencies during fabrication, differing operating conditions, etc. Thus, due to the differences in timing characteristics and because the master memory unit 102 and the slave memory unit 104 share the common data pipeline 160, data collisions may occur at the data pipeline 160 when the master memory unit 102 and the slave memory unit 104 provide data to the data pipeline 160 at the same time. Delaying operation of the master memory unit 102 and/or the slave memory unit 104, and thereby delaying provision of data to the data pipeline 160, via a configurable delay circuit (DLY) 130(0) and/or a configurable delay circuit 130(1), respectively, may improve reliability of the apparatus 100. It is appreciated that, while FIG. 1 depicts a single slave memory unit 104, the apparatus 100 may include any number of additional slave memory units in addition to the slave memory unit 104. For example, memory units according to embodiments of the present disclosure may be included in multi-memory systems having 4, 8, 16, 32, and so on, memory units. In some embodiments the master memory unit 102 and the slave memory unit 104 may be identical. Accordingly, each of the master memory unit 102 and the slave memory unit 104 may have the same architecture, including memory addressing, with some circuitry or components designated for the master memory unit 102 disabled on the slave memory unit 104.

The master memory unit 102 may include control logic 110 configured to receive control signals CTRL from an external source (not shown), such as a memory controller. Responsive to the CTRL signals, the control logic 110 may provide associated control signals CSM to local control logic 120(0) of the master memory unit 102 and slave control signals CSS to local control logic 120(1) of the slave memory unit 104. The local control logic 120(0) may be configured to provide, to the memory 140(0), master row control signals RCSM to the memory 140(0) via row control logic 124(0) and column control signals CCSM via column control logic 122(0) and through the configurable delay circuit 130(0). In some embodiments, the configurable delay circuit 130(0) may be configured to delay receipt of the CCSM signal at the memory 140(0) based on a value indicated by a fuse bank 134(0). For example, the configurable delay circuit 130(0) may include a plurality of delay gates, and a number of active delay gates of the plurality of delay gates of the configurable delay circuit 130(0) may be based on a value indicated via the fuse bank 134(0). The configurable delay circuit 130(0) delays receipt of the CCSM signal at the memory 140(0) by providing the CCSM signal through the active delay gates of the configurable delay circuit 130(0). Responsive to receiving the CCSM signal, the memory 140(0) may initiate a column start operation as part of a memory access operation. The column start operation may result in the memory 140(0) providing data to the data pipeline 160 based on the RCSM and CCSM signals. The memory 140(0) may also be configured to provide a control signal QINM to a control buffer (CTRL) 150 via a connection point 192 contemporaneously with provision of the data to the data pipeline 160. The control buffer 150 may provide associated control signals QIN<i> based on the QINM signal to direct the data pipeline 160 to store the data provided by the memory 140(0).

Referring to the slave memory unit 104, the local control logic 120(1) may be configured to provide, to the memory 140(1), row control signals RCSS via row control logic 124(1) to the memory 140(1) and column control signals CCSS via column control logic 122(1) and through the configurable delay circuit 130(1). In some embodiments, the configurable delay circuit 130(1) may be configured to delay receipt of the CCSS signal at the memory 140(1) based on a value indicated by a fuse bank 134(1). Similar to the configurable delay circuit 130(0), the configurable delay circuit 130(1) may include a plurality of delay gates, and a number of active delay gates of the configurable delay circuit 130(1) may be based on a value indicated via the fuse bank 134(1). The configurable delay circuit 130(1) may be configured to delay receipt of the CCSS signal at the memory 140(1) by providing the CCSS signal through the active delay gates of the configurable delay circuit 130(1). Responsive to receiving the CCSS signal, the memory 140(1) may initiate a column start operation as part of a memory access operation. The column start operation may result in the memory 140(1) providing data to the data pipeline 160 via a connection point 190 based on the RCSS and CCSS signals. The memory 140(1) may also be configured to provide a control signal QINS to the control buffer 150 via the connection point 192 contemporaneously with provision of the data from the memory 140(1) to the data pipeline 160. The control buffer 150 may further provide the associated control signals QIN<i> based on the QINS signal to direct the data pipeline 160 to store the data. In some embodiments, the CTRL buffer 150 may include a first in, first out FIFO buffer to provide the associated control signals QIN<i>.

In operation, the control logic 110 may receive CTRL signals, such as a memory command (e.g., memory read request, a memory write request), a clock, a clock enable, a write enable, a chip select signal, etc., and address signals to perform a memory access operation. Based on values of the CTRL signals, the control logic 110 may be configured to provide control signals (e.g., the CSM signal or the CSS signal), to the local control logic 120(0) or the local control logic 120(1), respectively. For the master memory unit 102, responsive to receiving the CSM signal, the local control logic 120(0) may be configured to provide row control information to the memory 140(0) via the RCSM signals.

Following provision of the row control information via the RCSM signal, the local control logic 120(0) may be configured to provide column control information to the memory 140(0) via the CCSM signal. At the memory 140(0), responsive to receipt of the row control information received via the RCSM signals, the memory 140(0) may be configured to initiate a memory access operation based on the row control information. Responsive to receipt of the column control information via the CCSM signal, the memory 140(0) may be configured to continue the memory access operation by initiating a column start operation based on the column control information. The column start operation may result in the memory 140(0) being configured to retrieve data based on the row control information and the column control information, and to provide the data to the data pipeline 160 and the QINM signal to the CTRL buffer 150 via the connection point 192, contemporaneously.

The slave memory unit 104 may be configured to operate similarly to the master memory unit 102. Thus, responsive to receiving the CSS signal, the local control logic 120(1) may be configured to provide row control information to the memory 140(1) via the RCSS signal. Following provision of the row control information via the RCSS signal, the local control logic 120(1) may be configured to provide column control information to the memory 140(1) via the CCSS signal. At the memory 140(1), responsive to receipt of the row control information received via the RCSS signal, the memory 140(1) may be configured to initiate a memory access operation based on the row control information. Responsive to receipt of the column control information via the CCSS signal, the memory 140(1) may be configured to continue the memory access operation by initiating a column start operation based on the column control information. The column start operation may result in the memory 140(1) being configured to retrieve data based on the row control information and the column control information, and to provide the data to the data pipeline 160 and the QINS signal to the CTRL buffer 150, contemporaneously. The memory 140(1) may be coupled to the master memory unit 102 via the connection points 190 and 192, such as a through-silicon vias, in order to provide data and the QINS signal from the memory 140(1) to the data pipeline 160. The QINM signal and QINS signal may exhibit the same delay characteristics to the data pipeline 160 relative to one another, and relative to delay characteristics of a data path along which the data is provided from the memory 140(0) and the memory 140(1), respectively, to the data pipeline 160. Thus, the QINM signal and the QINS signal may each be routed through the connection point 192 in order to match a delay of the data along the data path through the connection point 190 that is used to provide data from the memory 140(1). In some embodiments, the QINM signal may be routed through a load circuit on the master memory unit 102 that emulates a load of the connection point 192.

The control buffer 150 may provide the associated QIN<i> signals directing the data pipeline 160 to store the data from the memory 140(0) and the data from the memory 140(1) contemporaneous with receipt of the respective data at the data pipeline 160. In some embodiments, the control buffer 150 may be omitted, and the QINM signal may be provided to the data pipeline by the master memory unit 102 to direct the data pipeline to store data from any of the memory units, including the slave memory unit 104.

As explained above, the master memory unit 102 and the slave memory unit 104 may have the same architecture and/or may be fabricated using the same process. However, certain characteristics may vary between the master memory unit 102 and the slave memory unit 104 due to variability in the fabrication process. As a result, the master memory unit 102 and the slave memory unit 104 may exhibit differences in timing characteristics. Thus, the timing of when data is provided by a respective memory 140 to the data pipeline 160 responsive to a memory command (e.g., a read command) may be different for the master memory unit 102 and the slave memory unit 104, which may result in data collisions at the data pipeline 160 for consecutive memory commands. For example, if a timing characteristic of the master memory unit 102 has a delay from the master local control logic 120(0) to the data pipeline 160 that is greater relative to a delay from the slave local control logic 120(1) to the data pipeline 160, data provided from the master memory unit 102 may collide with data provided from the slave memory unit 104 for consecutive memory commands.

Accordingly, a control signal that causes a memory to output data may be delayed, and as a result, may alter the timing of when data is output relative to a memory command. For example, the configurable delay circuit 130(0) and/or the configurable delay circuit 130(1) may be configured to delay receipt of respective column control information via the CCSM and/or CCSS signals at the memory 140(0) and/or the memory 140(1), respectively. A length of a delay through the configurable delay circuit 130(0) and/or the configurable delay circuit 130(1) may be determined based on relative timing characteristic differences between the master memory unit 102 and the slave memory unit 104. These relative timing characteristic differences may be measured as described further with reference to FIG. 5. In some embodiments, a configurable delay circuit of a memory unit having a longest latency (e.g., a slowest memory unit) may be configured to have a minimal delay (e.g., zero delay gates activated) based on a corresponding fuse bank. Further, configurable delay circuits of other memory units may have delays greater than the minimal delay (e.g., one or more active delay gates) based on a respective fuse bank, such that the respective delay (e.g., number of active delay gates) approximates a respective relative timing characteristic difference as compared with the slowest memory unit.

For example, with reference to the apparatus 100, which includes two memory units, the master memory unit 102 may be determined to have a timing characteristic that is 12 gates (e.g., 12 g) slower than the slave memory unit 104. Thus, the master memory unit 102 is determined to be the slowest of the two memory units. Accordingly, the master fuse bank 134(0) has a value indicating zero active delay gates of the configurable delay circuit 130(0) (e.g., the CCSM signal is minimally delayed through the configurable delay circuit 130(0)). Responsive to the configurable delay circuit 130(0) having zero active delay gates, the CCSM signal is received at the memory 140(0) with minimal delay. Further, the slave fuse bank 134(1) may have a value indicating 12 active delay gates of the configurable delay circuit 130(1). Responsive to the configurable delay circuit 130(1) having 12 active delay gates, the CCSS signal is received at the memory 140(1) after delay through 12 delay gates. Delaying receipt of the CCSS signal at the memory 140(1) may accordingly delay when data is provided from the memory 140(1) to the data pipeline 160 (e.g., by delaying receipt of the respective column control information, initiation of the column start operation of the memory access operation is delayed accordingly, as described above). Further, delay of the CCSS signal may also delay provision of the QINS signals to the control buffer 150, such that the data from the memory 140(1) and the associated QINS signal are provided from the memory 140(1) contemporaneously. In this example, delaying the CCSS signal (and as a result delaying when data is provided by the memory 140(1)) may reduce likelihood of a data collision at the data pipeline 160 between the data from the memory 140(0) and the data from the memory 140(1) for consecutive memory commands.

It will be appreciated that selection of a delay through a respective configurable delay circuit may depend on a resolution of the configurable delay circuit. Thus, the delay set in the configurable delay circuit may be an approximation of the relative timing difference with the memory unit having the slowest relative timing as allowed by the configurable delay circuit. For example, if it is determined that relative timing between a memory unit and the slowest memory unit is 15 g, and delays available at the configurable delay circuit of the memory unit are 12 g and 16 g, the memory unit may select the 16 g delay. In other embodiments, the memory unit may select set the configurable delay circuit to a delay that approximates the relative timing difference without being greater than the relative timing difference, and, thus, may set the delay circuit to the 12 g delay. In some embodiments, timing characteristics and relative differences between timing characteristics may be determined during production, and the Rise banks (e.g., the fuse bank 134(0) and the fuse bank 134(1)) may be programmed at that time. The fuse bank 134(0) and/or the fuse bank 134(1) may include programmable elements. In some embodiments, the fuse bank 134(0) and/or the fuse bank 134(1) may include fuses, anti-fuses, or a combination thereof. In other embodiments, the timing characteristics may be determined periodically in the field. Thus, the number of active delay gates of a configurable delay circuit may be controlled based on an associated delay control signal for each memory unit. Each respective delay control signal may be provided by the control logic 110, in some embodiments.

Figure 2:
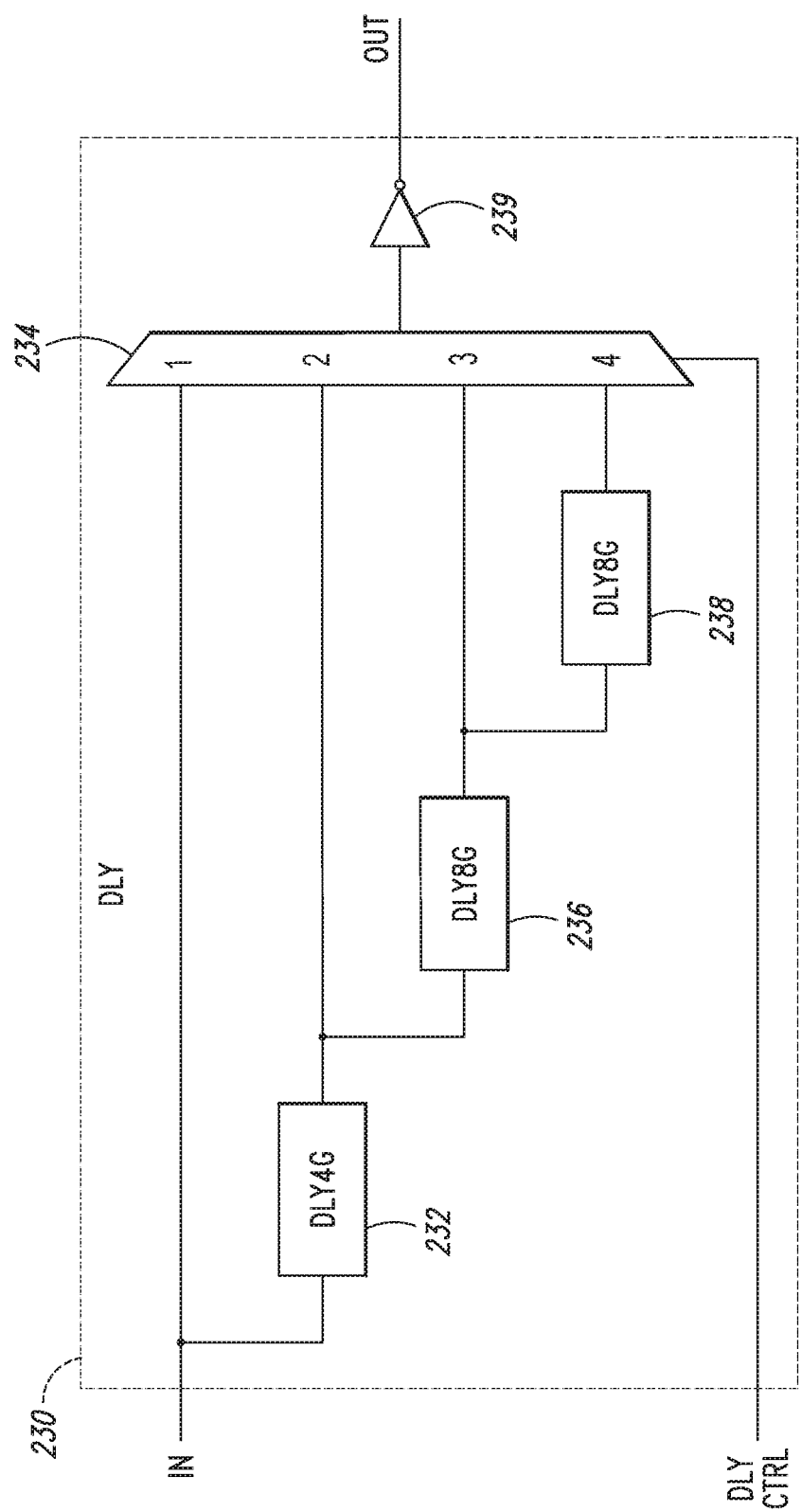
FIG. 2 is a block diagram of a particular illustrative embodiment of a configurable delay circuit.

Referring to FIG. 2, a particular illustrative embodiment of a configurable delay circuit is disclosed and generally designated 230. The configurable delay circuit 230 may include a delay architecture configured to provide an output signal OUT at an output based on an input signal IN through the configurable delay circuit 230. The configurable delay circuit 230 may be used for the configurable delay circuit 130(0) or the configurable delay circuit 130(1) of FIG. 1.

The configurable delay circuit 230 may include cascading delay stages (e.g., a 4 g delay stage 232, an 8 g delay stage 236, and an 8 g delay stage 238), each configured to provide an IN signal to a multiplexer 234 after an associated delay. In some embodiments, the multiplexer 234 is a four input multiplexer configured to receive: the IN signal at a first input (e.g., no delay), the IN signal delayed through the 4 g delay stage 232 at a second input, the IN signal delayed through the 4 g delay stage 232 and the 8 g delay stage 236 at a third input, and the IN signal delayed through the 4 g delay stage 232, the 8 g delay stage 236, and the 8 g delay stage 238 at a fourth input. In an example, the 4 g delay stage 232 is a 4 gate (g) delay, the 8 g delay stage 236 is an 8 g delay, and the 8 g delay stage 238 is an 8 g delay. Thus, the first input may be a 0 g delay, the second input may be a 4 g delay, the third input may be a 12 g delay, and the fourth input may be a 20 g delay. It is appreciated that the 4 g delay stage 232, the 8 g delay stage 236, and the 8 g delay stage 238 may have any combination of delay lengths. The 4 g delay stage 232, the 8 g delay stage 236, and the 8 g delay stage 238 may include a plurality of delay gates, such as may include inverters, NAND gates, etc., to produce an associated delay length. The multiplexer 234 is configured to provide the OUT signal based on one of the four inputs via a buffer 239. In some embodiments, the multiplexer 234 is configured to select one of the four inputs to provide at the output responsive to a value of the DLY CTRL signal. The DLY CTRL signal may be provided by or derived from via an associated fuse bank, such as the fuse bank 134(0) or fuse bank 134(1) of FIG. 1.

While FIG. 2 depicts the multiplexer 234 as a four-input multiplexer, the multiplexer 234 may be replaced by four switching elements (e.g., transistors, tri-state inverters, etc.), with a respective switching element coupled between an associated input of the multiplexer 234 and the buffer 239. Further, the configurable delay circuit 230 may be configured with more or less than three delay stages, and each delay stage may have any number of delay gates.

Figure 3:
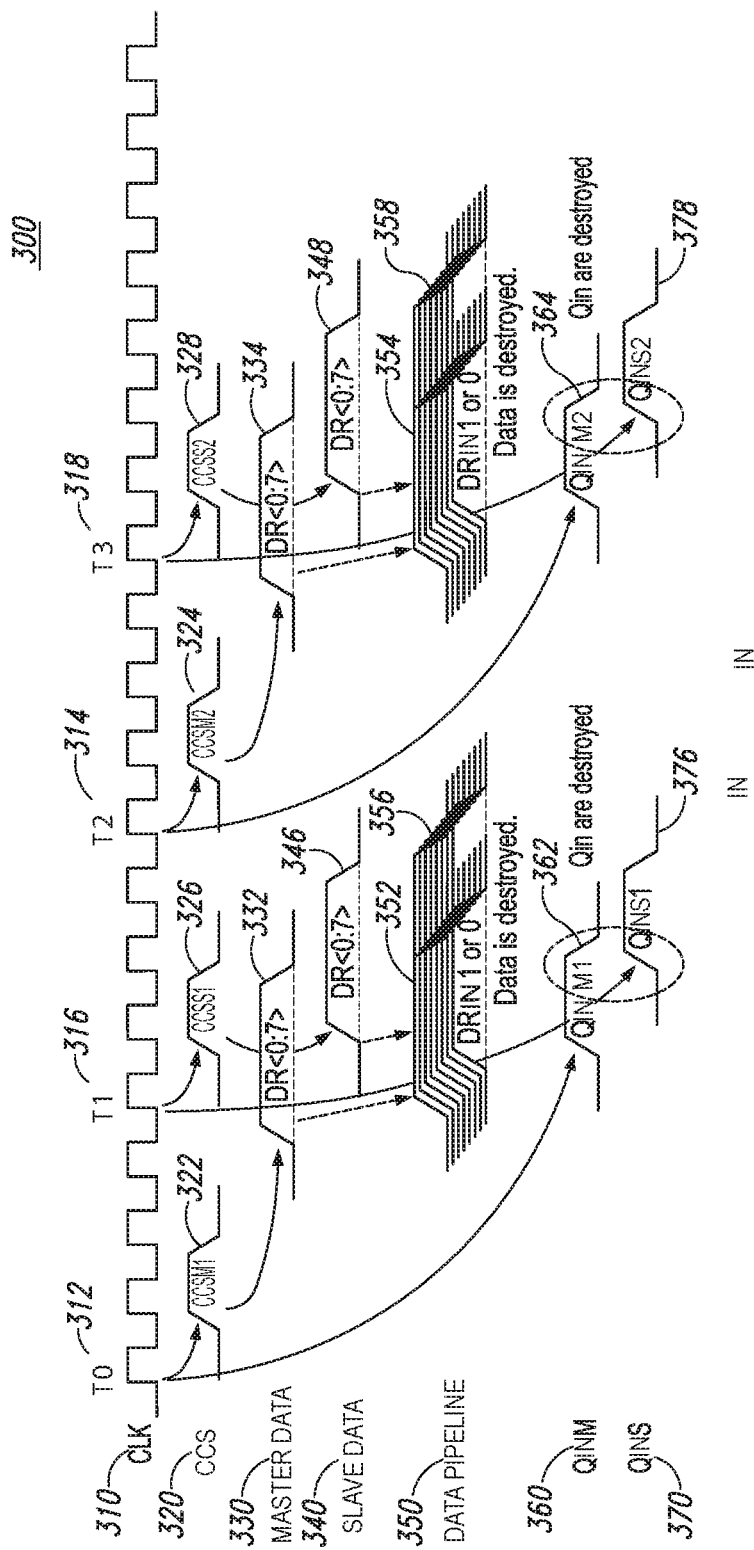
FIG. 3 is an exemplary timing diagram of a particular illustrative embodiment of a multi-memory system.
Figure 4:
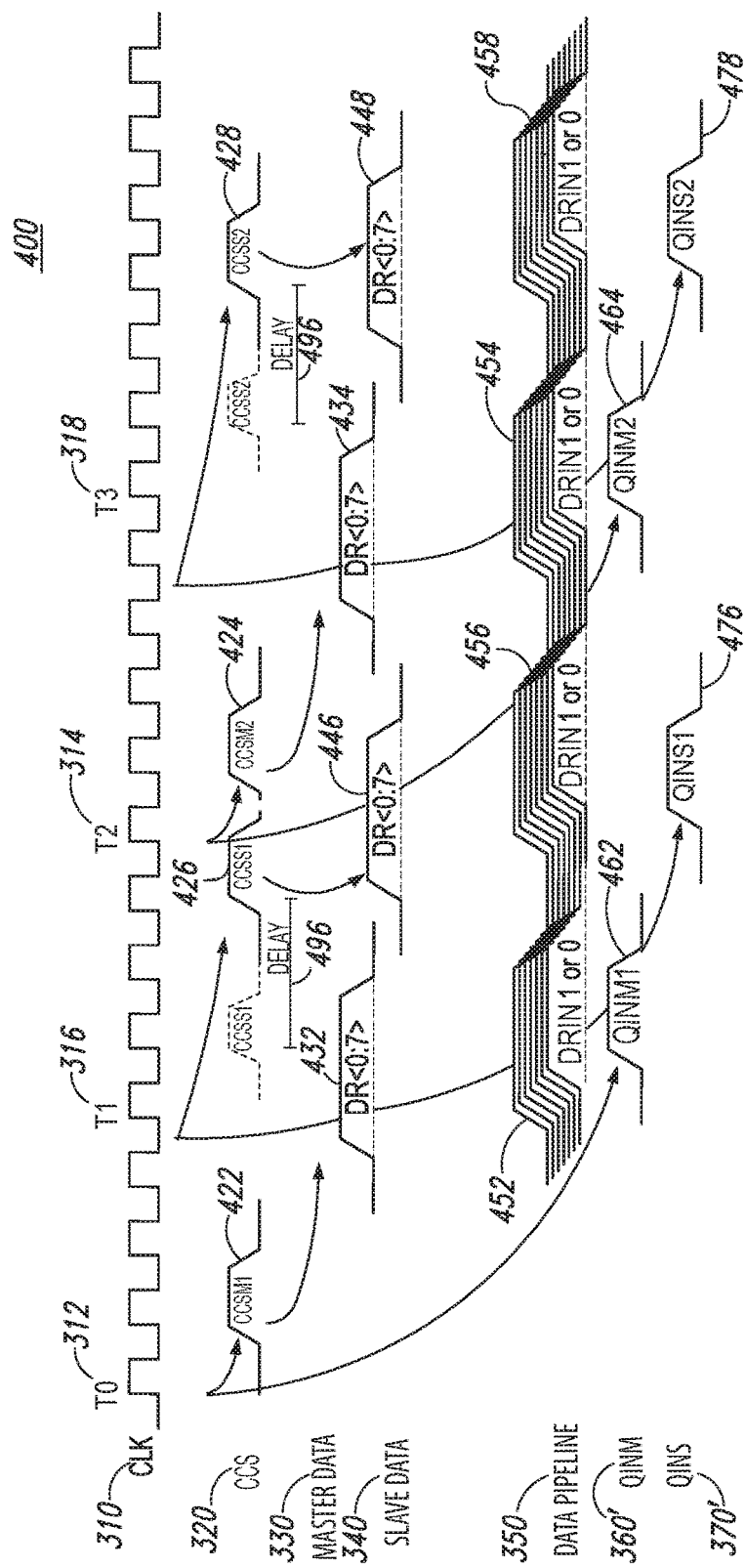
FIG. 4 is an exemplary timing diagram of a particular illustrative embodiment of a multi-memory system with configurable delay circuits.

Referring to FIGS. 3 and 4, exemplary timing diagrams of a particular illustrative embodiment of multi-memory system timing, where data access timing of a memory of a slave memory unit is faster relative to data access timing of a memory of a master memory unit. For example, an exemplary timing diagram 300 may illustrate timing characteristics of the apparatus 100 of FIG. 1 without the configurable delay circuit 130(0) or the configurable delay circuit 130(1), and an exemplary timing diagram 400 may illustrate timing characteristics of the apparatus 100 of FIG. 1 including the configurable delay circuit 130(0) or the configurable delay circuit 130(1). Clock signal (CLK) 310 represents a clock signal used to time receipt of memory commands by a multi-memory system: first master memory command RDM1 312 at time T0, first slave memory command RDS1 316 at time T1, second master memory command RDM2 314 at time T2, and second slave memory command RDS2 318 at time T3. The RDM1 312 and RDM2 314 memory commands are directed to a master memory unit, such as the master memory unit 102 of FIG. 1. The RDS1 316 and RDS2 318 memory commands are directed to a slave memory unit, such as the slave memory unit 104 of FIG. 1.

Column control signal CCS 320 represents exemplary relative timing of receipt of the CCS signal 320 at the respective memory based on the respective memory command. For example, the CCSM1 signal 322, associated with the RDM1 command 312, is received at the memory of the master memory unit (e.g., memory 140(0)) at a first time; the CCSS1 signal 326, associated with the RDS1 command 316, is received at the memory of the slave memory unit (e.g., memory 140(1)) at a second time; the CCSM2 324, associated with the signal the RDM2 command 314, is received at the memory of the master memory unit at a third time; and the CCSS2 signal 328, associated with the RDS2 command 318, is received at the memory of the slave memory unit at a fourth time.

The MASTER DATA 330 represents timing of the provision of data from the memory of a master memory unit responsive to a memory command directed to the master memory unit. For example, the first master data 332 associated with the RDM1 command 312 is output from the memory of the master memory unit responsive to receiving the CCSM1 signal 322, and the second master data 334 associated with the RDM2 command 314 is output from the memory of the master memory unit responsive to receiving the CCSM2 signal 324.

The SLAVE DATA 340 represents timing of the provision of data from the memory of a slave memory unit responsive to a memory command directed to the slave memory unit. For example, the first slave data 346 associated with the RDS1 command 316 is output from the memory of the slave memory unit responsive to receiving the CCSS1 signal 326, and the second slave data 348 associated with the RDS2 command 318 is output from the memory of the slave memory unit responsive to receiving the CCSS2 signal 328.

As explained above, the master memory unit and the slave memory unit may have different timing characteristics, and, thus, timing of provision of data from the memory of the master memory unit (e.g., MASTER DATA 330) and/or from memory of the slave memory unit (e.g., SLAVE DATA 340) is based on the respective memory unit timing characteristics and on the timing of receipt of the respective CCS signal 320 at a respective memory.

The DATA PIPELINE 350 represents a shared data pipeline for receiving data from both the master memory unit and the slave memory unit. As is indicated in the example of FIG. 3, since the slave memory unit has faster timing characteristics that the master memory unit, the arrival of the first slave data 356 (associated with the RDS1 command 316) at the data pipeline overlaps a portion of the first master data 352 (associated with the RDM1 command 312). This collision between the first master data 352 and the first slave data 356 causes each of these data at the data pipeline 350 to be destroyed. Similarly, the arrival of the second slave data 358 (associated with the RDS2 command 318) at the data pipeline overlaps a portion of the second master data 354 (associated with the RDM2 command 314), which causes each of these data to also be destroyed.

Further, master control signals QINM 360 and slave control signals QINS 370 correspond to the master data 330 and the slave data 340, respectively, which direct the data pipeline to store the received data, are dependent on the timing characteristics of the respective memory unit. For example, the QINM1 signal 362 is provided to the data pipeline contemporaneously with the first master data 352 and the QINS1 signal 376 is provided to the data pipeline contemporaneously with the first slave data 356. Thus, the QINM1 signal 362 may collide with the QINS1 signal 376. Similarly, the QINM2 signal 364 is provided to the data pipeline contemporaneously with the second master data 354 and the QINS2 signal 378 is provided to the data pipeline contemporaneously with the second slave data 358. Thus, the QINM2 signal 364 may collide with the QINS2 signal 378.

According to some embodiments of this disclosure, data collisions at the data pipeline can be prevented by delaying the CCS signals 320 based on relative differences in timing characteristics between the memory units. Referring to FIG. 4, the memory commands 312, 314, 316, and 318 are received with similar timing as the memory commands 312, 314, 316, and 318 of FIG. 3. Implementing a delay of the CCS signals 320, such as through the configurable delay circuit 130(0) or configurable delay circuit 130(1) of FIG. 1, may prevent data output from the memory of the master memory unit and output from the memory of the slave memory unit from colliding at the DATA PIPELINE 350. For example, in the timing diagram of FIG. 4, the data access timing of the memory of the slave memory unit is less than the data access timing of the memory of the master memory unit. As depicted in FIG. 4, the data associated with the master read commands RDM1 312 and RDM2 314 are output as the first master data 452 and second master data 454, respectively, as described with reference to FIG. 3.

Although the memory commands are received with similar timing as indicated in FIG. 3, the data associated with the slave memory commands RDS1 316 and RDS2 318 are delayed. As shown in the exemplary timing diagram of FIG. 4, the CCSS1 signal 426 and the CCSS2 signal 428 are each delayed by a delay 496. The delay 496 increases a data access delay of the slave memory unit to approximate a timing characteristic of the master memory unit (e.g., the slowest memory unit in this example), and may be implemented using the configurable delay circuit 130(1) of FIG. 1 and/or the configurable delay circuit 230 of FIG. 2. The delay 496 serves to delay downstream processing an associated memory command. Thus, by delaying provision of the CCSS1 signal 326, the first slave data 346, the first slave data 356 (at the data pipeline), and the QINS1 signal 376 are accordingly delayed by approximately the delay 496. FIG. 4 illustrates the delayed data and signals as the CCSS1 signal 426, the first slave data 446, the first slave data 456 (at the data pipeline), and the QINS1 signal 476. Therefore, the first slave data 456 avoids collision with the first master data 452 and the QINS1 signal 476 avoids collision with the QINM1 signal 462. Similarly, by delaying provision of the CCSS2 signal 328, the second slave data 348, the second slave data 358, and the QINS2 signal 378 are accordingly delayed by approximately the delay 496. FIG. 4 illustrates the delayed data and signals as CCSS2 signal 428, the second slave data 448, the second slave data 458 (at the data pipeline), and the QINS1 signal 476. Therefore, the second slave data 458 avoids collision with the second master data 454 and the QINS2 signal 478 avoids collision with the QINM2 signal 464.

The exemplary timing diagrams 300 and 400 are non-limiting illustrations to provide a sufficient understanding of embodiments of the disclosure. It will be appreciated that the relative timing of the signals of the exemplary timing diagrams 300 and 400 may vary from multi-memory system to multi-memory system, or within a multi-memory system. For example, the delay 496 may be less or greater than shown in the exemplary timing diagram 400. Further, a data access time of the memory of the master memory unit may be faster than a data access time of the memory of the slave memory unit, and thus the master memory unit may implement a delay to the associated CCS signals 320, while the slave memory unit may implement a minimal or no delay. The multi-memory system described in the exemplary timing diagrams 300 and 400 may be expanded to include more than two memory units, with each memory unit of the more than two memories units including a delay of the associated CCS signal 320 based on data timing characteristics of a respective memory unit relative to timing characteristics of a memory unit of the slowest memory unit of the more than two memory units.

As described, the length of the delays implemented to delay of the CCS signals 320 via the configurable delay circuits (e.g., via the configurable delay circuit 130(0) and/or the configurable delay circuit 130(1) of FIG. 1)) may be based on relative differences in timing characteristics of each memory unit of a multi-memory system as compared with a slowest memory unit of a multi-memory system. Thus, relative timing characteristics of each memory unit in a multi-memory system may be measured to determine which memory unit of the multi-memory system has a slowest relative timing. The delays applied to remaining memory units in the multi-memory system are independently determined based on relative differences in timing characteristics as compared with the slowest memory unit in the multi-memory system. Determining relative timing characteristics of memory units in the multi-memory system may be determined using many different methodologies and architectures.

Figure 5:
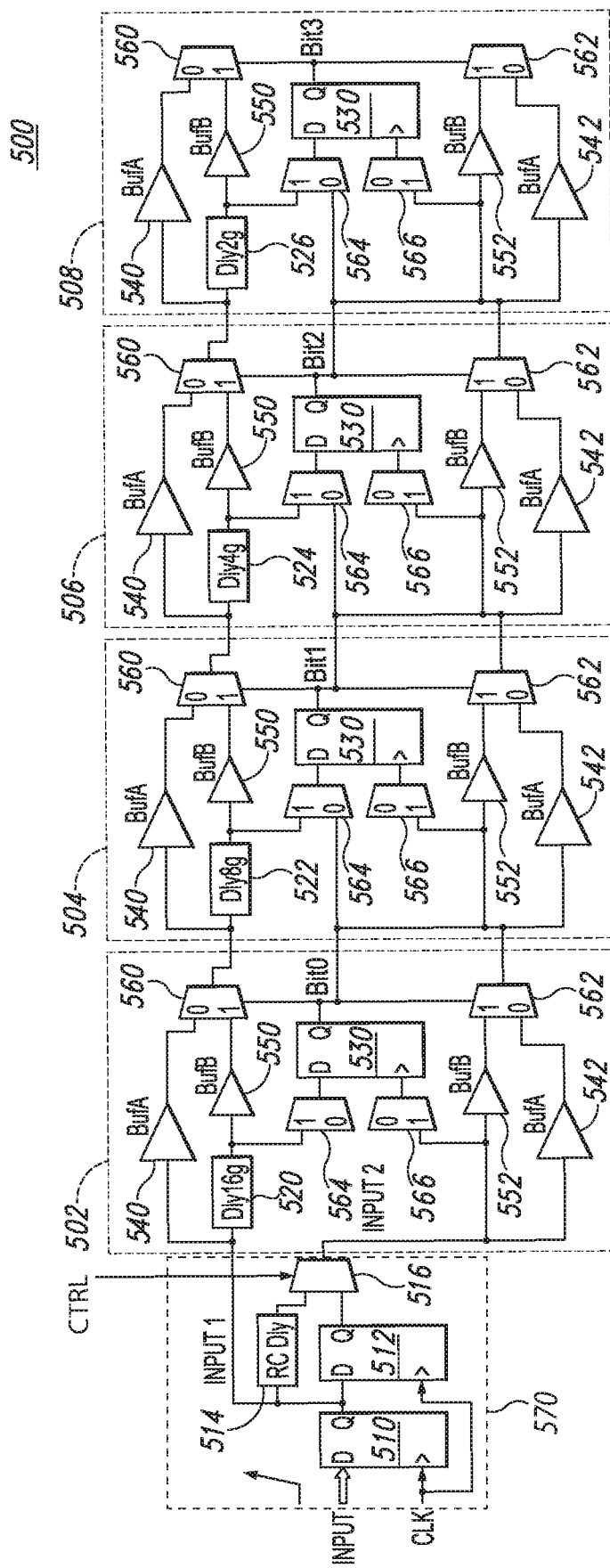
FIG. 5 is a block diagram of a particular illustrative embodiment of relative timing measurement circuit of a multi-memory system.

FIG. 5 provides one example of a timing characteristic measurement circuit that may be used to determine relative timing characteristics of memory units of a multi-memory system. The timing characteristic measurement circuit 500 of FIG. 5 uses two signals (e.g., INPUT1 and INPUT2) separated by a defined time gap to determine relative data access timing of the memory of a memory unit.

As depicted in FIG. 5, the timing characteristic measurement circuit 500 may include an input circuit 570. The input circuit is configured to receive an input signal INPUT, a clock signal CLK, and a control signal CTRL. The input circuit 570 may include a first flip-flop FF 510 coupled to both a resistor-capacitor circuit RC 514 and a second FF 512. The first FF 510 may be configured to receive the INPUT signal at an input and the CLK signal at a clocking input, and to provide the INPUT1 signal at an output responsive to an edge of the CLK signal. The RC circuit may be configured to receive the INPUT1 signal and provide an output to a first input of a multiplexer 516. The second FF 512 may be configured to receive an INPUT1 signal at an input and the CLK signal at a clocking input, and to provide a signal to a second input of the multiplexer 516. The multiplexer may be configured to provide the INPUT2 signal at an output having a logical value of the first input or the second input based on a value of the CTRL signal. For example, when the CTRL signal has a first value, a logical value of the output of the RC circuit 514 is provided at an output of the multiplexer 516, and when the CTRL signal has a second value, a logical value of the output of the second FF 512 is provided at an output of the multiplexer 516. In some embodiments, the second FF 512 may be used when a time difference between the INPUT1 signal and INPUT2 signal being a length of a period of the CLK signal is sufficient, and the RC circuit 516 may be used when a time difference between the INPUT1 signal and INPUT2 signal is required to be greater than a period of the CLK The tinning characteristic measurement circuit 500 may further include delay units 502, 504, 506 and 508. Each delay unit 502, 504, 506 and 508 may include a respective delay element 520, 522, 524, and 526 and a respective FF 530. The architecture of each of the delay units 502, 504, 504, and 508 may be similar, with differences in a number of delay gates in each respective delay element 520, 522, 524, and 526. As shown, the INPUT1 signal is provided to the 16 gate (g) delay element 520 and to an A buffer BUFA 540. The output of the 16 g delay element is provided to an input of the FF 530 via a first FF multiplexer 564 and to a B buffer BUFB 550. A multiplexer 560 receives the output of the BUFA 540 and the BUFB 550, and provides an output based on a signal received from a BIT0 output of the FF 530. The output of the multiplexer 560 is provided to an 8 g delay element 522 and a BUFA 540 of a second delay unit 504.

The INPUT2 signal is provided to a second FF multiplexer 566, a B buffer BUFB 552, and an A buffer BUFA 542. The output of the second FF multiplexer 566 is provided to a clocking input of the FF 530. The FF 530 latches the BIT0 output at an output, which is provided to a control input of the multiplexer 560 and a control input of a multiplexer 562 of the first delay unit 502, and to the first FF multiplexer 564, the second FF multiplexer 566, the BUFB 552, and the BUFA 542 of the second delay unit 504.

The INPUT1 signal and the INPUT2 signal propagate through the third delay unit 506 and the fourth delay unit 508 similar to propagation through the first delay unit 502 and the second delay unit 508. Further, similar to the BIT0 output of the FF 530 of the first delay unit 502 provided to the second delay unit 504, the BIT1 output from the FF 530 of the second delay unit 504 is provided to the third delay unit 506, and the BIT2 output of the FF 530 of the third delay unit 506 is provided to the fourth delay unit 508, and the BIT3 output is provided at an output of the FF 530 of the fourth delay unit 508.

In operation, as described above, the INPUT1 signal and the INPUT2 signal are each provided to the delay units 502, 504, 506, and 508, and the INPUT2 signal is delayed relative to the INPUT1 signal. The timing characteristic measurement circuit 500 is configured to perform a timing characteristic test to determine an approximate number of delay gates necessary to delay the INPUT1 signal such that timing of the INPUT1 signal matches timing of the INPUT2 signal by propagating the INPUT1 signal through a combination of the delay elements 520, 522, 524, and 526. For example, the INPUT1 signal is propagated through the 16 g delay 520 to an input of the FF 530. If the INPUT1 signal does not reach the input of the FF 530 prior to the INPUT2 signal reaching the clocking input of the FF 530, then the FF 530 latches the BIT0 output as a low logical value, indicating a delay applied to the INPUT1 signal is less than 16 g to equal timing of the INPUT2 signal. Alternatively, if the INPUT1 signal reaches the input of the FF 530 prior to the INPUT2 signal reaching the clocking input of the FF 530, then the FF 530 latches the BIT0 output as a high logical value, indicating a delay applied to the INPUT1 signal must be at least 16 g to equal timing of the INPUT2 signal.

In the case where the 16 g delay exceeds a delay necessary for timing of the INPUT1 signal to equal timing of the INPUT2 signal, the INPUT1 signal is provided to the 8 g delay element 522 via BUFA 540 and multiplexer 560 of the first delay unit 502 (e.g., the INPUT1 signal provided to the second delay unit 504 bypasses the 16 g delay element 520), and the INPUT2 signal is provided to the second delay unit 504 via the BUFA 552 and the multiplexer 562 of the first delay unit. If the INPUT1 signal does not reach the input of the FF 530 prior to the INPUT2 signal reaching the clocking input of the FF 530, then the FF 530 latches the BIT1 output as a low logical value, indicating a delay applied to the INPUT1 signal is less than an 8 g to equal timing of the INPUT2 signal. Alternatively, for the second delay unit 504, if the INPUT1 signal reaches the input of the FF 530 prior to the INPUT2 signal reaching the clocking input of the FF 530, then the FF 530 latches the BIT1 output as a high logical value, indicating a delay applied to the INPUT1 signal must be at least 8 g to equal timing of the INPUT2 signal.

In the case where a delay necessary to equalize timing of the INPUT1 signal and the INPUT2 signal is at least 16 g, the INPUT1 signal is provided to the 8 g delay element 522 via the BUFB 550 and multiplexer 560 of the first delay unit 502 (e.g., the INPUT1 signal provided to the second delay unit 504 is delayed through the 16 g delay element 520), and the INPUT2 signal is provided to the second delay unit 504 via the BUFB 552 and the multiplexer 562 of the first delay unit. If the INPUT1 signal does not reach the input of the FF 530 prior to the INPUT2 signal reaching the clocking input of the FF 530, then the FF 530 latches the BIT1 output as a low logical value, indicating a delay applied to the INPUT1 signal is at least 16 g, but less than 24 g (e.g., 16 g+8 g) to equal timing of the INPUT2 signal. Alternatively, for the second delay unit 504, if the INPUT1 signal reaches the input of the FF 530 prior to the INPUT2 signal reaching the clocking input of the FF 530, then the FF 530 latches the BIT1 output as a high logical value, indicating a delay applied to the INPUT1 signal must be at least 24 g to equal timing of the INPUT2 signal.

Propagation through the third delay unit 506 and the fourth delay unit 508 continues similarly to propagation through the first delay unit 502 and the second delay unit 504. Thus, the INPUT1 signal is propagated through any combination of the delay elements 520, 522, 524, and 526 to determine a delay in terms of a number of gates that approximates a time delay between the INPUT1 signal and the INPUT2 signal, with a resolution of two gates. A number represented by the BIT0/1/2/3 outputs may indicate the number of gates that approximated the time delay. For a multi-memory system, each memory unit (e.g., the master memory unit 102 and the slave memory unit 104 of FIG. 1) may implement the timing characteristic test using a respective timing characteristic measurement circuit 500, and each memory unit may produce a respective count of delay gates that represents a delay between the INPUT1 signal and the INPUT2 signal. The respective counts may be compared to determine which memory unit has a smallest count, which may be identified as a slowest memory unit. Relative timing differences between the slowest memory unit and each remaining memory units may be determined by comparing a count of gates of the slowest memory unit is a respective count of each of the remaining memory units. Thus, if the slowest memory unit had a count of 4 g, and a particular memory unit had a count of 8 g, then the particular memory unit is approximately 4 g faster or twice as fast over the time period difference between the INPUT1 signal and INPUT2 signal.

As explained above, the timing characteristic measurement circuit 500 described with reference to FIG. 5 is an example implementation for determining relative timing characteristic differences between memory units of a multi-memory system. Other timing methodologies and architectures may be used to determine relative timing characteristic differences. Further, the timing characteristic measurement circuit 500 may be modified to include more or less delay units. The timing characteristic measurement circuit 500 may also be modified to include delay elements having different delay gates than indicated in the delay elements 520, 522, 524, and 526, which may produce better or worse resolution than the timing characteristic measurement circuit 500 of FIG. 5 (e.g., including a delay element with a single delay gate would increase resolution to 1 g, or having a smallest delay element of 4 g would decrease resolution to 4 g).

Figure 6:
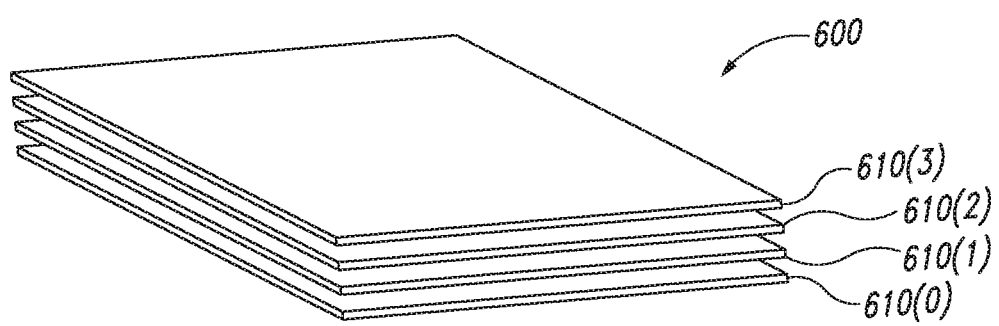
FIG. 6 is an illustration of a multi-memory system according to one embodiment of the disclosure.

FIG. 6 illustrates a multi-memory system 600 according to an embodiment of the disclosure. In the embodiment shown, the multi-memory system 600 is a stacked multi-memory system including a 4-high memory unit stack. Each memory unit includes a configurable delay circuit according to an embodiment of the present disclosure, such as the configurable delay circuit 130(0) and/or the configurable delay circuit 130(1) of FIG. 1 and/or the configurable delay circuit 230 of FIG. 2. Further, the multi-memory system 600 may be configured to determine relative timing characteristic difference between each memory unit of the 4-high memory unit stack, such as by including a timing characteristic measurement circuit (e.g., the timing characteristic measurement circuit 500 of FIG. 5). In the embodiment shown, the bottom memory unit may be designated as the master memory unit 610(0), with a first slave memory unit 610(1), second slave memory unit 610(2), and third slave memory unit 610(3) stacked on top of it. As discussed above, memory groups according to embodiments of the present disclosure may be stacked in configurations 8-high, 16-high, 32-high, and so on. In some configurations the memory units may be stacked directly on top of one another, while in others, they may be offset.

Those of ordinary skill would further appreciate that the various illustrative logical blocks, configurations, circuits, and algorithm steps described in connection with the embodiments disclosed herein may be implemented as electronic hardware, computer software executed by a processor, or combinations of both. Various illustrative components, blocks, configurations, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those having ordinary skill in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
   receiving a first memory command at a first memory unit at a first time;
   providing first column control signals to a memory of the first memory unit at a second time that is after the first time, responsive to receiving the first memory command;
   receiving a second memory command at a second memory unit at a third time that is after the second time; and
   responsive to receiving the second memory command, providing second column control signals to a memory of the second memory unit at a fourth time that is after the third time,
   wherein receipt of the second column control signals at the memory of the second memory unit is delayed by a delay time, and
   wherein the delay time is based on device timing characteristic differences between the first memory unit and the second memory unit to avoid data overlap at a data pipeline on the first memory unit and shared by the second memory unit.

2. The method of claim 1, wherein delaying receipt of second column control signals at the memory of the second memory unit by the delay time comprises providing the second column control signals through a plurality of delay gates.

3. The method of claim 1, further comprising:
   providing first row control signals to the memory of the first memory unit responsive to receiving the first memory command; and
   providing second row control signals to the memory of the second memory unit responsive to receiving the second memory command.

4. The method of claim 1, wherein the first memory command is received at the first memory unit before the second memory command is received at the second memory unit.

5. The method of claim 1, further comprising:
   providing first data to the data pipeline of the first memory unit based on the first memory command; and
   providing second data to the data pipeline based on the second memory command.

6. The method of claim 1, wherein the first memory unit and the second memory unit form a memory stack.

7. A method comprising:
   providing a first control signal in a first memory unit at a first time to initiate a memory operation in the first memory unit at a second time that is after the first time responsive to a first memory command; and
   providing a second control signal in a second memory unit at a third time that is after the second time to initiate the memory operation in the second memory unit at a fourth time that is after the third time responsive to a second memory command, wherein the first control signal is provided at a time different than the second control signal to account for relative timing characteristic differences between the first memory unit and the second memory unit in providing data to a data pipeline included in the first memory unit.

8. The method of claim 7, wherein the first control signal is provided prior to the second control signal based on the first memory unit having a slower timing characteristic than the second memory unit.

9. The method of claim 8, wherein providing the first control signal prior to the second control signal comprises providing the second control signal through a configurable delay circuit of the second memory unit.

10. The method of claim 8, further comprising:
    providing first data to the data pipeline from the first memory unit; and
    providing second data to the data pipeline from the second memory unit, wherein the first data is provided to the data pipeline after a first delay relative to receipt of the first memory command, and wherein the second data is provided to the data pipeline after a second delay that is an approximation of the first delay.

11. A method comprising:
    in a first memory device, receiving a first read command at a first time, and providing the first read command to a first memory of the first memory device at a second time that is after the first time;
    responsive to receiving the first read command at the first memory at the second time, providing first read data to a through-silicon via from the first memory;
    in a second memory device, receiving a second read command at a third time that is after the second time, and providing the second read command to a second memory of the second memory device at a fourth time that is after the third time;
    responsive to receiving the second read command at the second memory at the fourth time, providing second read data to the through-silicon via from the second memory;
    delaying at least one of the first read command to the first memory and the second read command to the second memory such that the first read data and the second read data do not overlap with each other on the through-silicon via.

12. The method of claim 11, wherein delaying the first read command comprises delaying the first read command by a first delay.

13. The method of claim 12, wherein delaying the second read command comprises delaying the second read command by a second delay.

14. The method of claim 13, wherein the second delay is longer than the second delay.

15. The method of claim 13, wherein the second delay approximates a relative timing difference between the first memory device and the second memory device.

16. The method of claim 13, wherein the second delay makes relative timing of providing the second read data to the through-silicon via from the second memory equal to an approximation of relative timing of providing the first read data to the through-silicon via from the first memory.

17. The method of claim 11, wherein the first memory device has a first timing characteristic and the second memory device has a second timing characteristic different from the first timing characteristic.

18. The method of claim 17, wherein the first and second memory devices have the same architecture.

19. The method of claim 11, further comprising:
providing a first control signal from the first memory to a data pipeline coupled to the through-silicon via; and
responsive to the first control signal, storing the first read data in the data pipeline.

20. The method of claim 19, further comprising:
providing a second control signal from the second memory to the data pipeline; and
responsive to the second control signal, storing the second read data in the data pipeline.

* * * * *